United States Patent
Miao et al.

(10) Patent No.: US 11,127,901 B1
(45) Date of Patent: Sep. 21, 2021

(54) THREE-DIMENSIONAL STACKED PHASE CHANGE MEMORY AND PREPARATION METHOD THEREOF

(71) Applicant: HUAZHONG UNIVERSITY OF SCIENCE AND TECHNOLOGY, Hubei (CN)

(72) Inventors: Xiangshui Miao, Hubei (CN); Hao Tong, Hubei (CN); Yushan Shen, Hubei (CN); Wang Cai, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 144 days.

(21) Appl. No.: 16/626,520

(22) PCT Filed: Nov. 29, 2018

(86) PCT No.: PCT/CN2018/118146
§ 371 (c)(1),
(2) Date: Dec. 25, 2019

(87) PCT Pub. No.: WO2020/056923
PCT Pub. Date: Mar. 26, 2020

(30) Foreign Application Priority Data

Sep. 18, 2018 (CN) .......................... 201811084770.3

(51) Int. Cl.
*H01L 45/00* (2006.01)
*H01L 27/24* (2006.01)

(52) U.S. Cl.
CPC ........ *H01L 45/1683* (2013.01); *H01L 27/249* (2013.01); *H01L 45/06* (2013.01);
(Continued)

(58) Field of Classification Search
CPC .................................................. H01L 45/1683
See application file for complete search history.

(56) References Cited

U.S. PATENT DOCUMENTS 8,953,361 B2 * 2/2015 Park .................. G11C 13/0002
365/148
2013/0005113 A1 1/2013 Kakegawa
(Continued)

FOREIGN PATENT DOCUMENTS

| CN | 104934531 | 9/2015 |
| CN | 106910743 | 6/2017 |

OTHER PUBLICATIONS

"International Search Report (Form PCT/ISA/210) of PCT/CN2018/118146," dated Jun. 7, 2019, pp. 1-5.

*Primary Examiner* — Mounir S Amer
(74) *Attorney, Agent, or Firm* — JCIPRNET

(57) ABSTRACT

A three-dimensional stacked phase change memory and a preparation method thereof are provided. The method comprises: preparing first horizontal electrodes spaced apart from each other on a substrate; preparing first strip-shaped phase change layers, each having a central gap, between the first horizontal electrodes; preparing first selectors in the central gaps of the first strip-shaped phase change layers; preparing a first insulating layer; preparing second strip-shaped phase change layers at same vertical positions on the first insulating layer; preparing second selectors; then preparing horizontally-oriented insulating holes between the horizontal electrodes; and preparing vertical electrodes between the adjacent insulating holes, thereby forming a multilayer stacked phase change memory with a vertical structure.

10 Claims, 14 Drawing Sheets

(52) U.S. Cl.
CPC ...... *H01L 45/1253* (2013.01); *H01L 45/1608* (2013.01); *H01L 45/1675* (2013.01)

(56) References Cited

U.S. PATENT DOCUMENTS

2014/0246643 A1     9/2014   Kim et al.
2014/0291603 A1*   10/2014   Song .................... H01L 45/145
                                                                                                                          257/4

* cited by examiner

THREE-DIMENSIONAL STACKED PHASE CHANGE MEMORY AND PREPARATION METHOD THEREOF

CROSS-REFERENCE TO RELATED APPLICATION

This application is a 371 application of the International PCT application serial no. PCT/CN2018/118146, filed on Nov. 29, 2018, which claims the priority benefit of China application no. 2018110847703, filed on Sep. 18, 2018. The entirety of each of the above-mentioned patent applications is hereby incorporated by reference herein and made a part of this specification.

BACKGROUND

Technical Field

The disclosure belongs to the technical field of microelectronic devices and memories, and more particularly relates to a three-dimensional stacked phase change memory and a preparation method thereof.

Description of the Related Art

As a new type of memory that is most likely to become one of the mainstream memories in the future, the phase change memory has gradually evolved into three dimensions to meet the demand for high-capacity storage in the era of big data, forming a multi-layer stacked phase change memory.

At present, the three-dimensional stacked phase change memories all adopt simple vertical stacking based on the cross-point array structure of horizontal electrodes. Although this structure is simple, with the increase of the number of stacked layers, the process steps are cumbersome, and the surface unevenness is intensified, bringing about the reliability problem. In addition, the feature size of the memory cell is limited by advanced photoetching processes, which are costly. Overall, it is not conducive to further multi-layer stacking and high-density integration.

SUMMARY

In view of the above-described defects or improvement requirements in the art, the present disclosure aims to provide a three-dimensional stacked phase change memory and a preparation method thereof, in which through improvements of the overall process design of the key preparation method, the shape setting of respective structures and so on, compared with the prior art, the present disclosure can effectively solve problems in the process preparation of the three-dimensional stacked phase change memory such as complicated steps for multi-layer stacking, large difficulty in process realization and scaling down of unit size. The present disclosure adopts a vertical electrode structure to construct a three-dimensional phase change storage array, in which the feature size of the phase change unit is determined by the film thickness (for example, the thickness of the phase change layer can be as low as 2 nm, which exceeds the limitation of the photoetching process), and phase change units of the formed three-dimensional stacked phase change memory are located at spatial overlapping regions between the horizontal electrodes and the vertical electrodes, thereby effectively simplifying the preparation process.

In order to achieve the above objective, according to an aspect of the present disclosure, there is provided a method for preparing a three-dimensional stacked phase change memory, comprising the following steps.

Step (1): preparing N strips of first horizontal electrodes that are parallel in a certain direction and spaced apart from each other on a substrate, where N is a preset positive integer greater than or equal to 2;

Step (2): preparing first strip-shaped phase change layers, each having a central gap, in regions corresponding to intervals between respective two adjacent electrodes of the first horizontal electrodes;

Step (3): preparing first selectors by filling a selector material in the central gaps of the first strip-shaped phase change layers;

Step (4): preparing a first insulating layer made of an insulating material such that the first insulating layer covers the first horizontal electrodes, the first strip-shaped phase change layers and the first selectors, with partial regions of the respective first horizontal electrodes exposed to form first horizontal electrode pins;

Step (5): preparing N strips of second horizontal electrodes on the first insulating layer such that the second horizontal electrodes have the same interval distribution as the first horizontal electrodes, and projections of the second horizontal electrodes on the first insulating layer are completely covered by projections of the first horizontal electrodes on the first insulating layer;

Step (6): preparing second strip-shaped phase change layers, each having a central gap, in regions corresponding to intervals between respective two adjacent electrodes of the second horizontal electrodes such that the second strip-shaped phase change layers have the same central gap distribution as the first strip-shaped phase change layers, and projections of the second strip-shaped phase change layers on the first insulating layer are covered by projections of the first strip-shaped phase change layers on the first insulating layer;

Step (7): preparing second selectors by filling a selector material in the central gaps of the second strip-shaped phase change layers;

Step (8): preparing a second insulating layer made of an insulating material such that the second insulating layer covers the second horizontal electrodes, the second strip-shaped phase change layers and the second selectors, with partial regions of the respective second horizontal electrodes exposed to form second horizontal electrode pins;

Step (9): preparing (N−1)×M insulating layer array through holes on a top-layer insulating layer, such that projections of the insulating layer array through holes correspond to regions corresponding to intervals between respective two adjacent electrodes of top-layer horizontal electrodes, each of the insulating layer array through holes has a width larger than the corresponding interval between the two adjacent electrodes, bottom surfaces of the insulating layer array through holes directly reach the substrate, and M is a preset positive integer greater than or equal to 2;

Step (10): filling an insulating material in the insulating layer array through holes to achieve electrothermal isolation in a horizontal direction;

Step (11): preparing vertical electrode array through holes between respective two adjacent insulating layer array through holes of the insulating layer array through holes whose projections correspond to regions corresponding to intervals between respective two adjacent electrodes of the top-layer horizontal electrodes, bottom surfaces of the vertical electrode array through holes directly reaching the substrate; and Step (12): filling an electrode material in the vertical electrode array through holes, thereby forming a multilayer stacked phase change memory.

Preferably, following steps are further included between the step (8) and the step (9): sequentially repeating the steps (4) to (8) for several times to form multiple layers of horizontal electrodes, strip-shaped phase change layers, selectors and insulating layers.

Further preferably, in the step (11), a total number of the vertical electrode array through holes is (N−1)×(M−1).

Further preferably, in the step (2), for any two adjacent electrodes of the first horizontal electrodes, the first strip-shaped phase change layer with the central gap has a width greater than the interval between the two adjacent electrodes of the first horizontal electrodes by 0 to 4 μm.

Further preferably, in the step (3), for any two adjacent electrodes of the first horizontal electrodes, the first selector has a width greater than that of the central gap of the first strip-shaped phase change layer by 0 to 4 μm.

Further preferably, in the step (1), the first horizontal electrodes have a line width of 2 μm to 30 μm, and are spaced 8 μm to 60 μm apart.

Further preferably, in the step (2), for any two adjacent electrodes of the first horizontal electrodes, the first strip-shaped phase change layer with the central gap has a width greater than the interval between the two adjacent electrodes of the first horizontal electrodes by 0 to 2 μm, and outer edges of the first strip-shaped phase change layer are located on the first horizontal electrodes.

Further preferably, in the step (3), for any two adjacent electrodes of the first horizontal electrodes, the first selector has a width greater than that of the central gap of the first strip-shaped phase change layer by 0 to 2 μm, and outer edges of the first selector are located on the first strip-shaped phase change layer.

Further preferably, in the step (1), the first horizontal electrodes are spaced apart from each other at the same interval; and in the step (2), the first strip-shaped phase change layers have the same line width and the same center gap width.

According to another aspect of the present disclosure, there is provided a three-dimensional stacked phase change memory prepared by the method according to the above method.

By comparing the above technical solution of the present inventive concept with the prior art, the present disclosure has the following beneficial effects. The existing 3D XPoint memory mainly adopts a planar three-dimensional stacking manner, in which a lower electrode (word line), an insulating layer, a selector layer, a phase change memory layer, an upper electrode (bit line) and so on are deposited layer by layer, and then the above steps are repeated to realize multi-layer stacking. The method adopts the existing preparation method of the planar phase change memory, in which the selector and the phase change memory can be integrated by simple continuous deposition. However, the number of times of photoetching operations is proportional to the number of the three-dimensional stacked layers, the cost of the photoetching process is increased sharply during the multi-layer stacking, and the preparation of each layer of electrodes causes a certain surface unevenness, leading to the serious device reliability problem in multi-layer stacking. Although a 3D XPoint memory based on vertical electrode is mentioned some materials (such as the master's thesis in the present research group "research on preparation process of 3D XPoint memory"), only a simple electrode structure diagram is provided, without disclosing the structural design and process implementation of the specific layers of the 3D XPoint memory and even considering the selectors required by the actual 3D XPoint memory. In the present disclosure, the size design of respective layers, the implementation of overlay, and the effective integration of the selectors and the storage units are the difficulties of the vertical three-dimensional stacking method compared with the horizontal stacking method. Compared with the existing 3D XPoint memory based on horizontal electrode structure, the present disclosure adopts a vertical electrode structure, in which all bit lines are deposited once by etched vias, which greatly reduces the number of times of photoetching operations during multi-layer stacking, and thus effectively reducing the cost; and in the preparation process, each functional material is almost contoured in the plane, and the excess material can be removed by etching, effectively alleviating the surface irregularity caused by multilayer stacking. In addition, the feature size of the memory cell according to the present disclosure is determined by the film thickness, not the processing line width, which increases the storage density to establish a large-capacity three-dimensional memory array, and reduces the phase change region size (as low as 2 nm) to reduce the operating current and the power consumption.

In summary, the present disclosure adopts a cross structure of a horizontal electrode and a vertical electrode to realize multi-layer stacking in a vertical direction. The phase change units have a small feature size and a relatively flat surface, which is advantageous for stacking more layers and reducing the operating current and the power consumption.

BRIEF DESCRIPTION OF THE DRAWINGS

FIG. 1A is a schematic view of a selected substrate.

FIG. 1Q is a schematic view showing preparation of vertical electrode array through holes on the above structure.

DETAILED DESCRIPTION OF THE EMBODIMENTS

For clear understanding of the objectives, features and advantages of the present disclosure, detailed description of the present disclosure will be given below in conjunction with accompanying drawings and specific embodiments. It should be noted that the embodiments described herein are only meant to explain the present disclosure, and not to limit the scope of the present disclosure. Furthermore, the technical features related to the embodiments of the present disclosure described below can be mutually combined if they are not found to be mutually exclusive.

In general, N strips of first horizontal electrodes that spaced apart from each other at the same interval in a certain direction are prepared on a substrate; first strip-shaped phase change layers, each having a central gap, are prepared between the first horizontal electrodes; first selectors are prepared in the central gaps of the first strip-shaped phase change layers; a first insulating layer is prepared on the above structure; N strips of second horizontal electrodes spaced apart from each other at the same interval in the same direction are prepared at the same vertical position on the first insulating layer; second strip-shaped phase change layers, each having a central gap, are prepared between the second horizontal electrodes; second selectors are prepared in the central gaps of the second strip-shaped phase change layers; a second insulating layer is prepared on the above structure; a third layer, a fourth layer, . . . are stacked in the same manner; then horizontal insulating holes are prepared between the horizontal electrodes; and vertical electrodes are prepared between the respective adjacent insulating holes, thereby forming a multi-layer stacked phase change memory with a vertical structure.

Figure 1A:
FIG. 1A to FIG. 1Q are schematic cross-sectional views in a direction perpendicular to the horizontal electrode direction, showing a process flow for preparing a three-dimensional stacked phase change memory with three stacked layers according to an embodiment of the present disclosure.
Figure 1B:
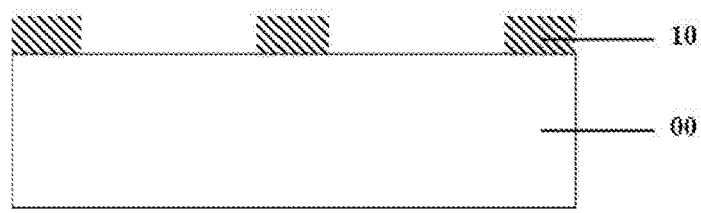
FIG. 1B is a schematic view showing preparation of first horizontal electrodes on a surface of the selected substrate.
Figure 1C:
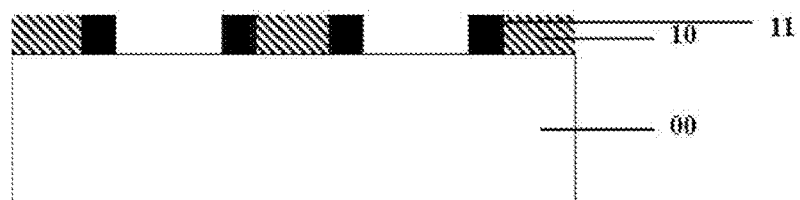
FIG. 1C is a schematic view showing preparation of first strip-shaped phase change layers having a central gap between the first horizontal electrodes.
Figure 1D:
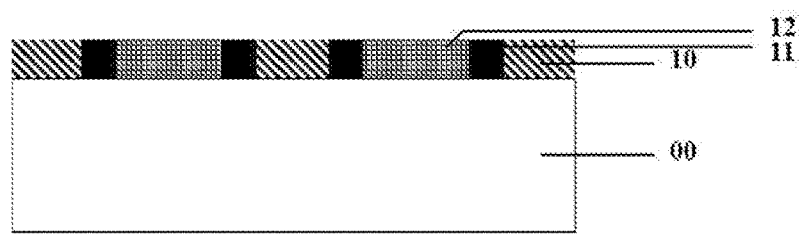
FIG. 1D is a schematic view showing preparation of first selectors by filling a selector material in the gaps of the first strip-shaped phase change layers.
Figure 1E:
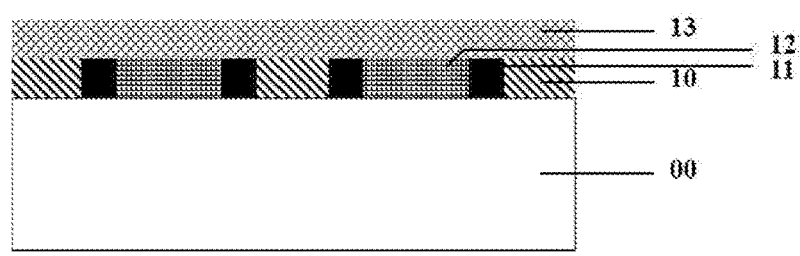
FIG. 1E is a schematic view showing preparation of a first insulating layer on the lower structure.
Figure 1F:
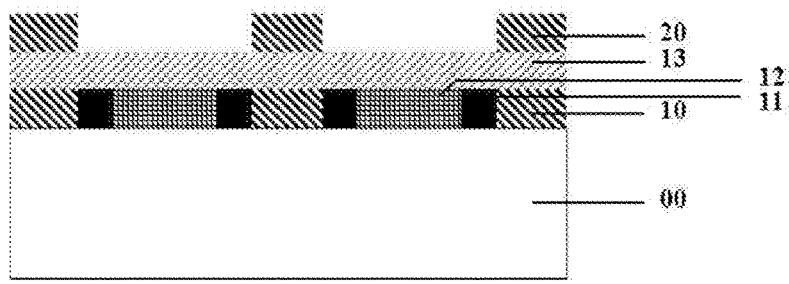
FIG. 1F is a schematic view showing preparation of second horizontal electrodes on the first insulating layer.
Figure 1G:
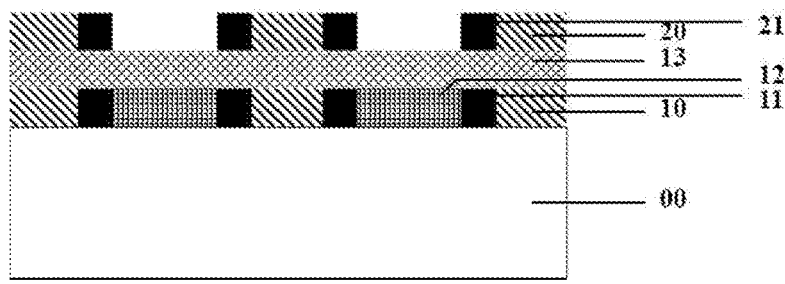
FIG. 1G is a schematic view showing preparation of second strip-shaped phase change layers having the same central gap between the second horizontal electrodes.
Figure 1H:
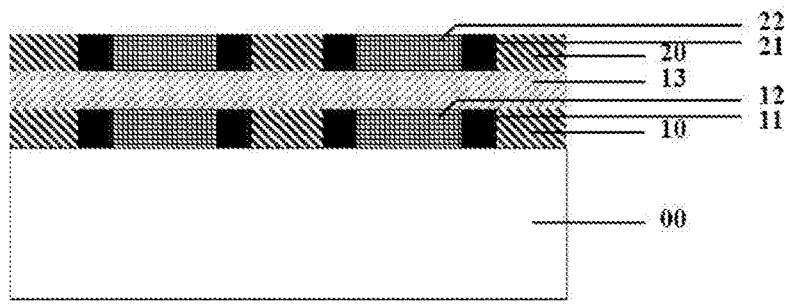
FIG. 1H is a schematic view showing preparation of second selectors by filling a selector material in the gaps of the second strip-shaped phase change layers.
Figure 1I:
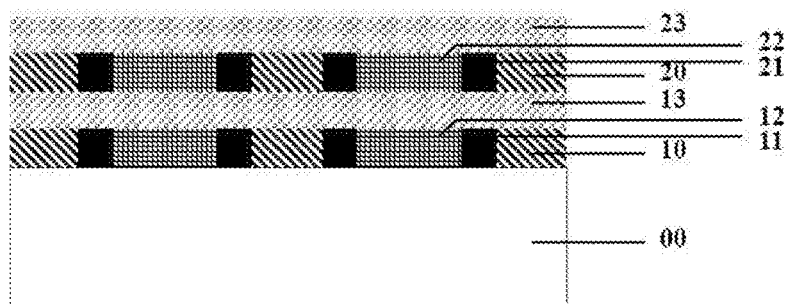
FIG. 1I is a schematic view showing preparation of a second insulating layer on the lower structure.
Figure 1J:
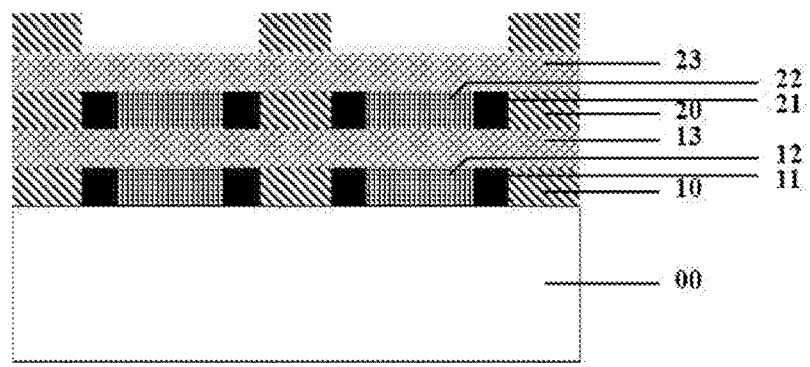
FIG. 1J is a schematic view showing preparation of third horizontal electrodes on the second insulating layer.
Figure 1K:
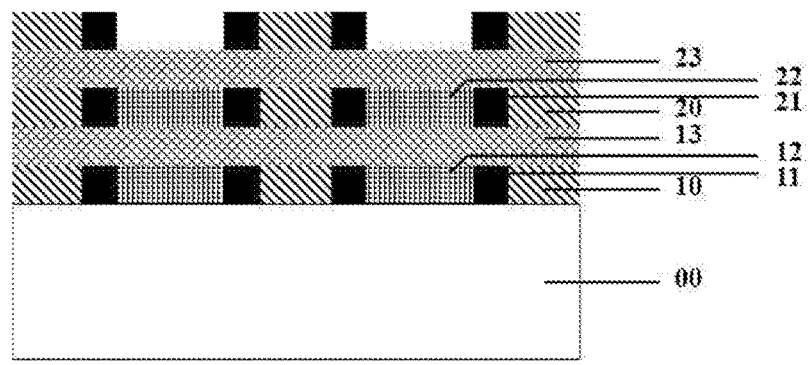
FIG. 1K is a schematic view showing preparation of third strip-shaped phase change layers having the same central gap between the third horizontal electrodes.
Figure 1L:
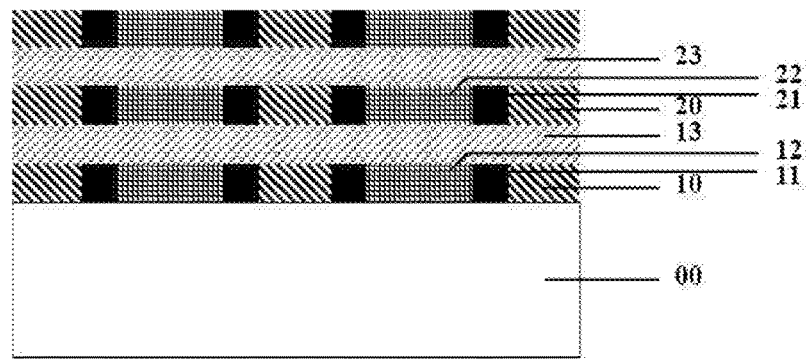
FIG. 1L is a schematic view showing preparation of third selectors by filling a selector material in the gaps of the third strip-shaped phase change layers.
Figure 1M:
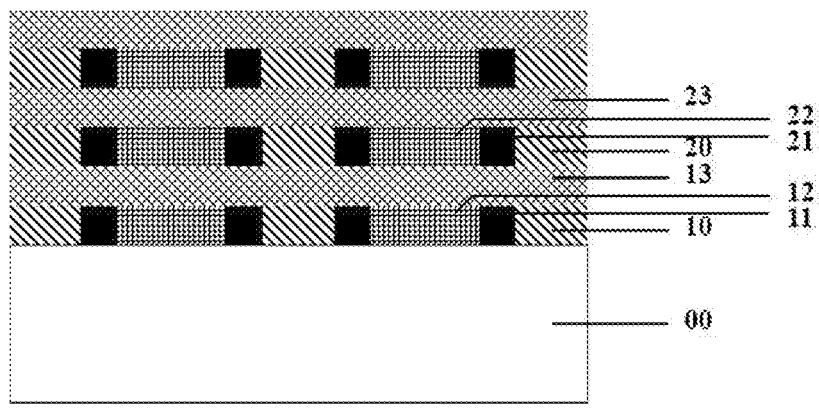
FIG. 1M is a schematic view showing preparation of a third insulating layer on the lower structure.
Figure 1N:
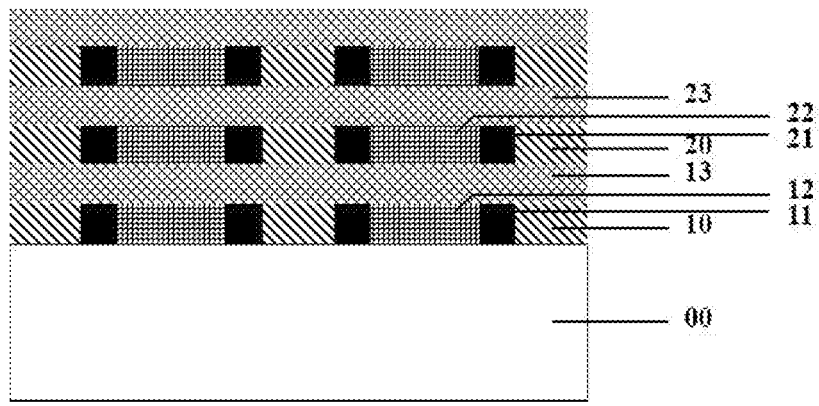
FIG. 1N is a schematic view showing preparation of horizontal insulating layer array through holes on the above structure.
Figure 1O:
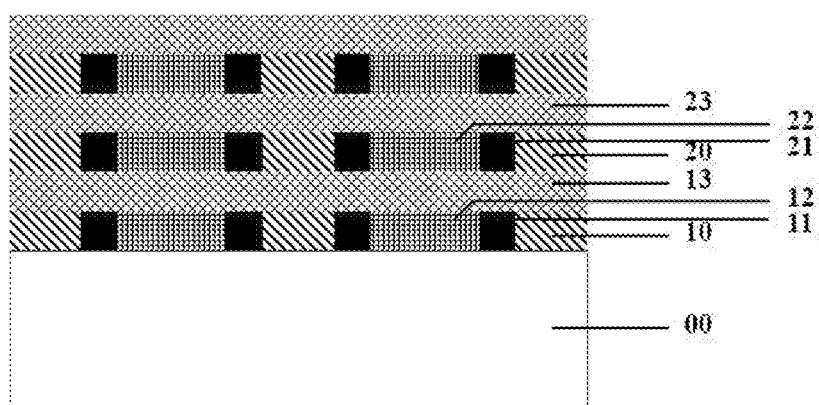
FIG. 1O is a schematic view showing preparation of a vertical isolation layer by filling an insulating material in the insulating layer array through holes.
Figure 1P:
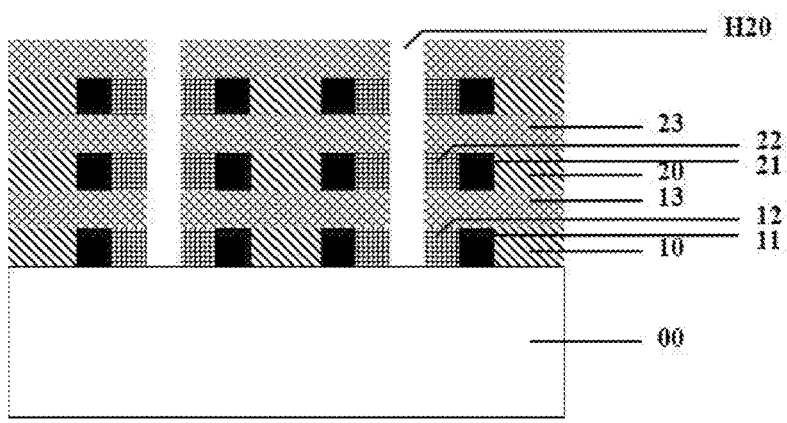
FIG. 1P is a schematic view showing preparation of vertical electrode array through holes on the above structure.
Figure 1Q:
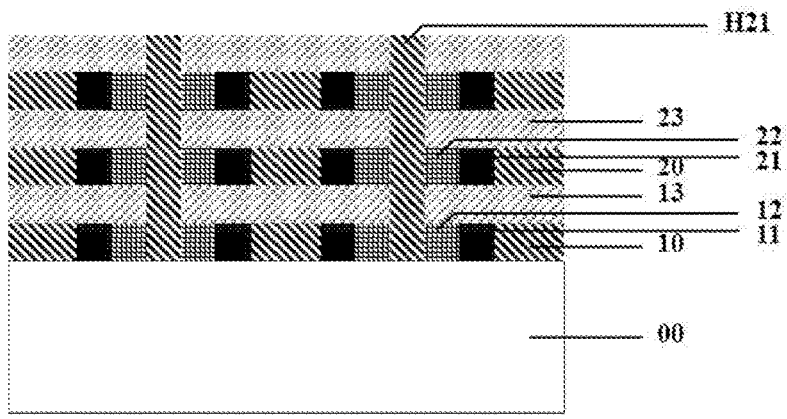

As shown in FIG. 1A to FIG. 1Q the method for preparing a three-dimensional stacked phase change memory according to the present disclosure may specifically comprise following steps.

Step (1): preparing N strips of first horizontal electrodes that spaced apart from each other at a same interval in a certain direction on a substrate, in which N is smaller than a maximum number of the first horizontal electrodes on the substrate in the direction; and in order to increase the storage density of the memory as much as possible, N can take as large a value as possible within the value range.

Step (2): preparing same first strip-shaped phase change layers, each having a central gap, between respective two adjacent electrodes of the first horizontal electrodes, in which each of the first strip-shaped phase change layers has a width greater than the interval between the first horizontal electrodes by 0 to 4 µm.

Step (3): filling a selector material in the central gaps of the first strip-shaped phase change layers;

Step (4): preparing a first insulating layer such that the first insulating layer covers the underlying structure, with first horizontal electrode pins exposed.

Step (5): preparing N strips of second horizontal electrodes at the same positions on the first insulating layer as the first horizontal electrodes, the second horizontal electrodes being the same as the first horizontal electrodes except for a slightly shorter length.

Step (6): between respective two adjacent electrodes of the second horizontal electrodes, preparing second strip-shaped phase change layers at the same positions as the first strip-shaped phase change layers, the second strip-shaped phase change layers are the same as the first strip-shaped phase change layers except for a slightly shorter length.

Step (7): filling a selector material in the central gaps of the second strip-shaped phase change layers.

Step (8): preparing a second insulating layer such that the second insulating layer covers the underlying structure, with second horizontal electrode pins exposed.

Step (9): repeating the above steps for stacking more layers.

Step (10): preparing N−1*M insulating layer array through holes at positions corresponding to the intervals of the horizontal electrodes, in which each of the insulating layer array through holes has a width larger than the electrode interval, bottoms of the insulating layer array through holes are the surface of the substrate, and M is smaller than a maximum number of the insulating layer array through holes in the horizontal electrode direction; and in order to increase the storage density of the memory as much as possible, M can take as large a value as possible within the value range.

Step (11): filling an insulating material in the insulating layer array through holes to achieve electrothermal isolation in a horizontal direction.

Step (12): preparing N−1*M−1 vertical electrode array through holes between respective two adjacent insulating layer array through holes of the insulating layer array through holes, bottoms of the vertical electrode array through holes are the surface of the substrate.

Step (13): filling an electrode material in the vertical electrode array through holes to obtain vertical electrodes.

Phase change units are located at spatial overlapping regions between the horizontal electrodes and the vertical electrodes. The horizontal electrodes in each layer have the same number, direction and line width except that the length decreases as the number of layers increases.

Taking the step (2) of preparing the first strip-shaped phase change layers as an example, each of the first strip-shaped phase change layers has a width greater than the interval between the first horizontal electrodes by 0 to 4 µm, which can ensure that the phase change layers can contact the electrodes under the overlay error. The first strip-shaped phase change layers can also be configured in the same way.

In the step (10), the insulating layer array through holes are configured to fill in the insulating material, thereby separating the phase change and the gate materials into different regions in the horizontal electrode direction, and the width of the respective insulating layer array through hole is slightly larger than the electrode interval to ensure the separation. In addition, in the present disclosure, the lengths of the horizontal electrodes sequentially decrease as the number of layers increases to form a stair type structure, with the lower electrode exposed.

Further, the first horizontal electrodes described above can be spaced apart from each other at a different interval in addition to the same interval (of course, other electrodes such as the second horizontal electrode and the third horizontal electrode are similar). The first strip-shaped phase change layers with a central gap can have different line widths or different central gap widths, in addition to the same line width and the same central gap width (of course, other strip-shaped phase change layers such as the second strip-shaped phase change layers and the strip-shaped phase change layers are similar). Different ways can be adopted as long as the lengths of the horizontal electrodes of different vertical heights vary gradiently (for example, the second horizontal electrode is shorter than the first horizontal electrode in the electrode direction) to ensure that pins of the horizontal electrodes of respective layers are exposed. In addition, the central gaps are configured to fill in a selector material, and each of the central gaps has a width larger than a side length of the vertical electrode.

A description of an embodiment is given below.

Embodiment 1

In this embodiment, a three-dimensional stacked phase change memory and a preparation method thereof are provided by taking a multilayer stacked memory as an example, and the method specifically includes the following steps.

Step 1: performing a photoetching process on a single crystal silicon substrate 00 to obtain a plurality of first horizontal electrode patterns having a line width of 10 μm and an interval of 15 μm in a certain direction, depositing a 100 nm TiW alloy electrode material on the photoetched substrate, and then performing a lift-off process to obtain first horizontal electrodes 10 corresponding to the photoetching patterns, as shown in FIG. 1A to FIG. 1B and FIG. 2A to FIG. 2B.

Figure 2A:
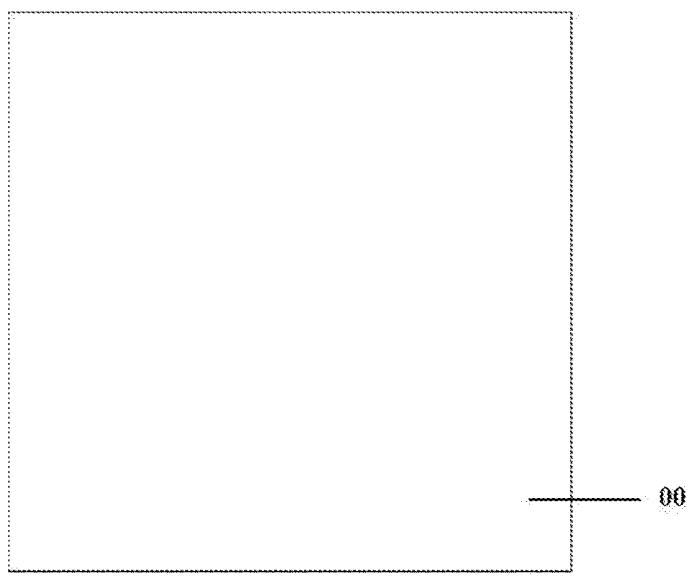
FIG. 2A to 2Q are schematic top views showing a process flow for preparing a three-dimensional stacked phase change memory with three stacked layers according to the embodiment of the present disclosure, in which FIG. 2A to 2Q schematically show processes corresponding to that of FIG. 1A to FIG. 1Q.
Figure 2B:
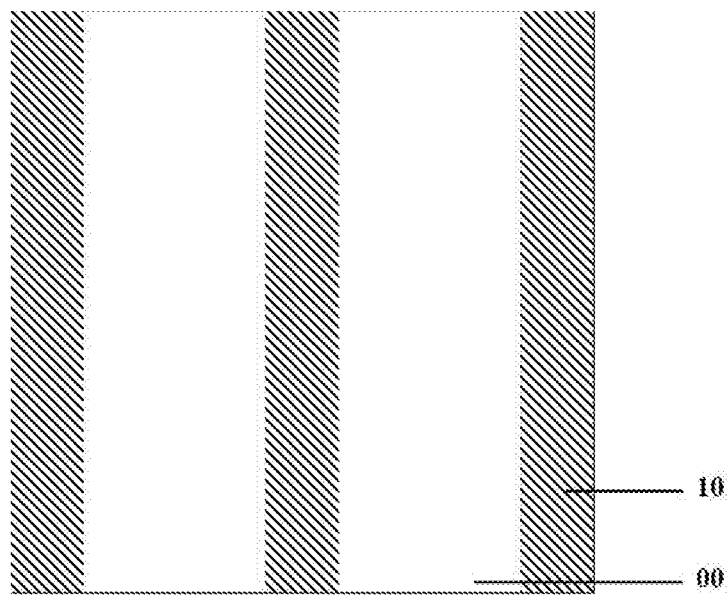
Figure 2C:
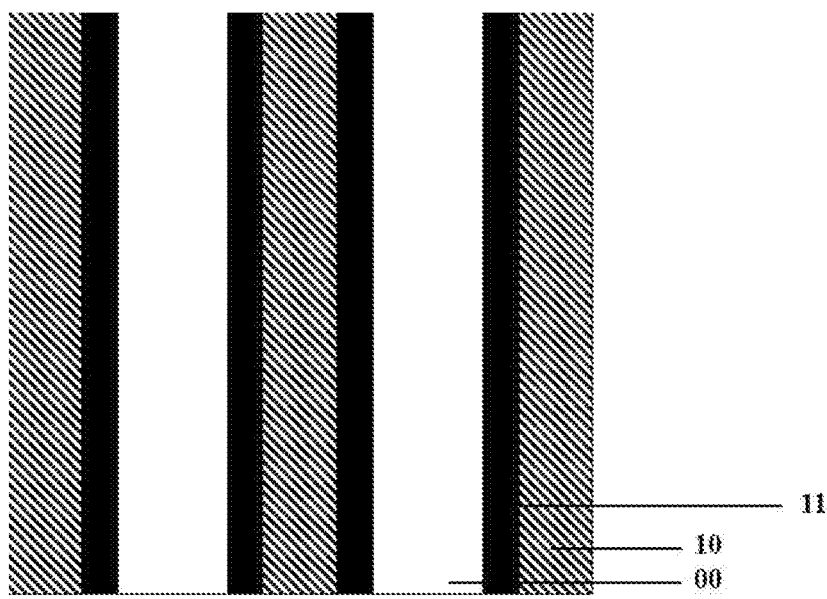

Step 2: on the basis of the step 1, performing a photoetching process to obtain first strip-shaped phase change layer patterns having a line width of 17 μm, a central gap of 10 μm and an interval of 8 μm, in which the patterns cover the intervals of the first horizontal electrodes 10, with edge parts of 1 μm on the first horizontal electrodes 10; depositing a 100 nm GST phase change material; and performing a lift-off process to obtain first phase change layers 11 corresponding to the photoetching patterns, which cover the first strip-shaped electrodes and have central gaps array through holes, as shown in FIG. 1C and FIG. 2C.

Figure 2D:
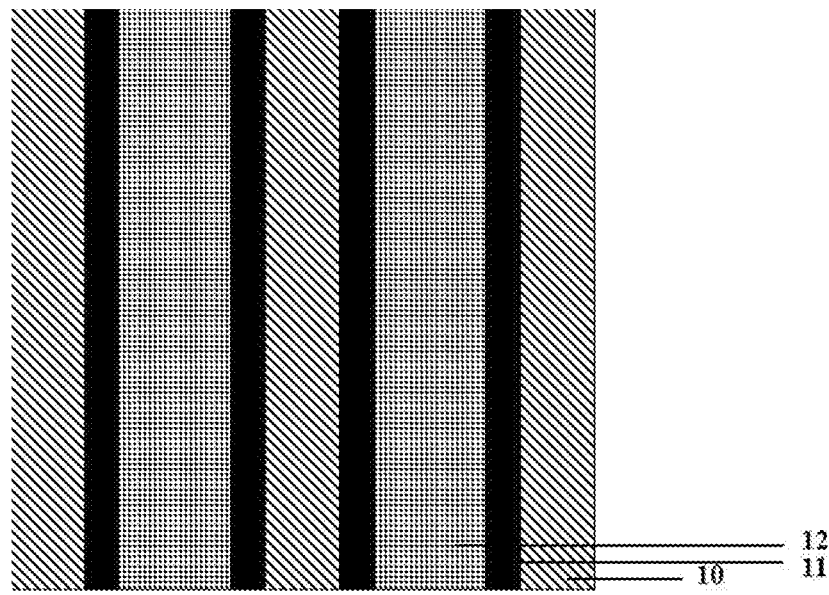

Step 3: on the basis of the step 2, performing a photoetching process in the central gaps of the first phase change layers and filling in a selector material to form first selectors 12, in which the line width is 12 μm, and edge parts of 1 μm are on the first phase change layers 11, as shown in FIG. 1D and FIG. 2D.

Figure 2E:
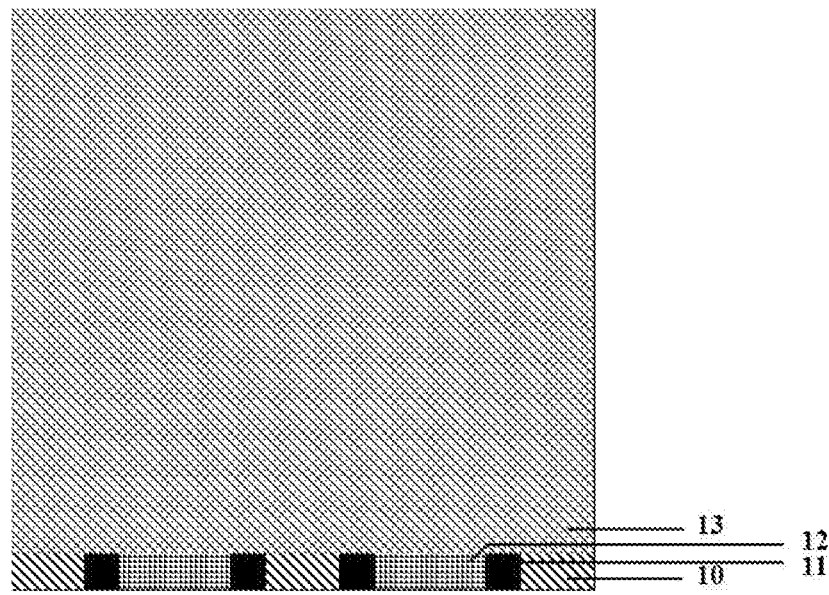

Step 4: on the basis of the step 3, performing a photoetching process and depositing a 100 nm $SiO_2$ insulating material to form a first insulating layer 13, which covers the underlying structure and exposes first horizontal electrode pins, as shown in FIG. 1E and FIG. 2E.

Figure 2F:
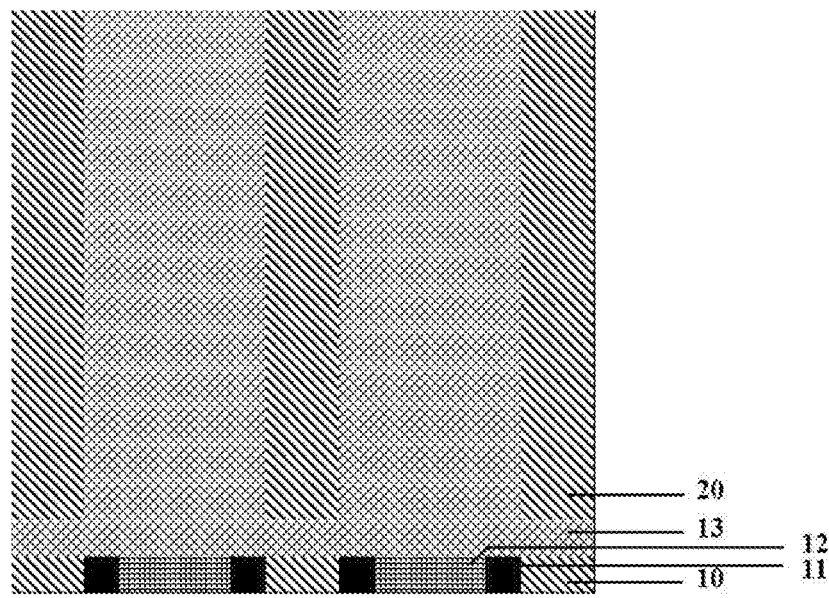

Step 5: preparing second horizontal electrodes 20 on the first insulating layer, in which the second horizontal electrodes 20 are the same as the first horizontal electrodes 10 except for a slightly shorter length, as shown in FIG. 1F and FIG. 2F.

Figure 2G:
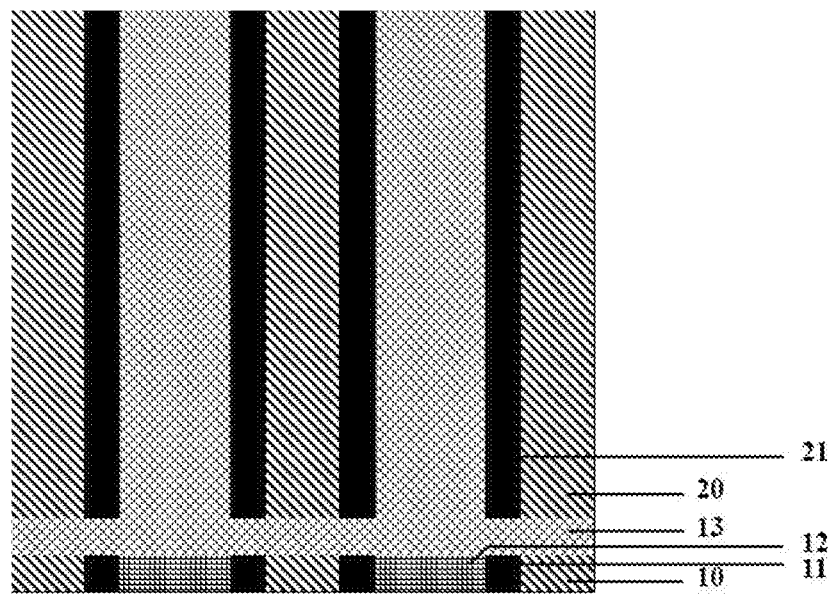

Step 6: on the basis of the step 5, performing a photoetching process to obtain second strip-shaped phase change layer patterns having a line width of 17 μm, a central gap of 10 μm and an interval of 8 μm, in which the patterns cover the intervals of the second horizontal electrodes 20, with edge parts of 1 μm on the second horizontal electrodes 20; depositing a 100 nm GST phase change material; and performing a lift-off process to obtain second phase change layers 21 corresponding to the photoetching patterns, which have central gaps as shown in FIG. 1G and FIG. 2G.

Figure 2H:
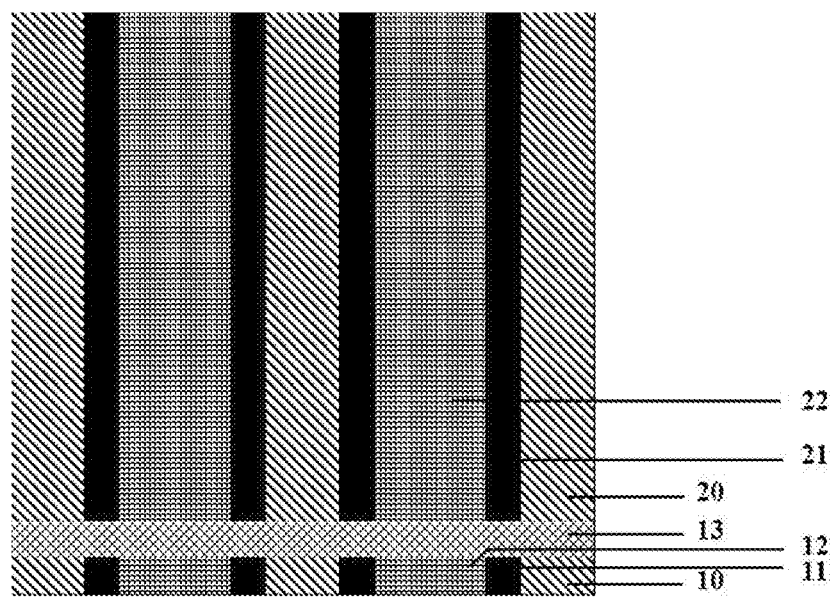

Step 7: on the basis of the step 6, performing a photoetching process in the central gaps of the second phase change layers and filling in a selector material to form first selectors 22, in which the line width is 12 μm, and edge parts of 1 μm are on the second phase change layers 21, as shown in FIG. 1H and FIG. 2H.

Figure 2I:
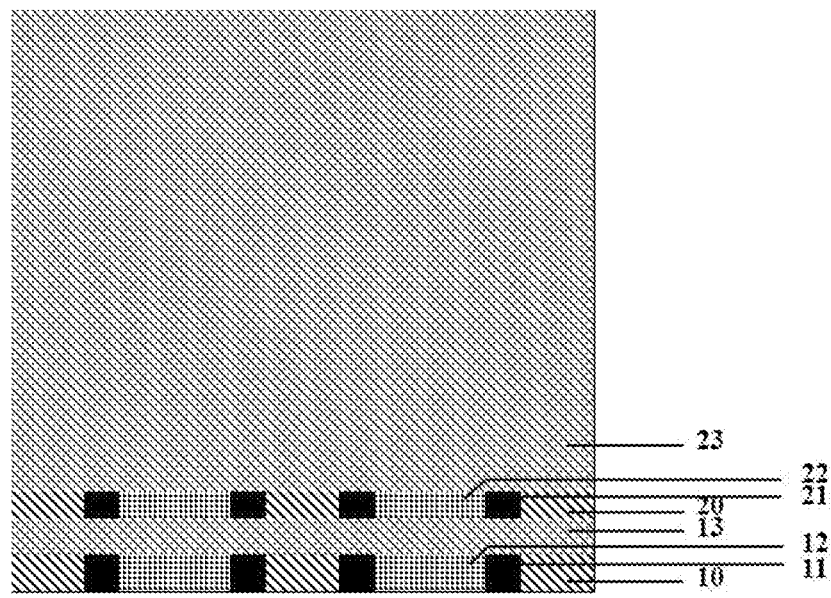
Figure 2J:
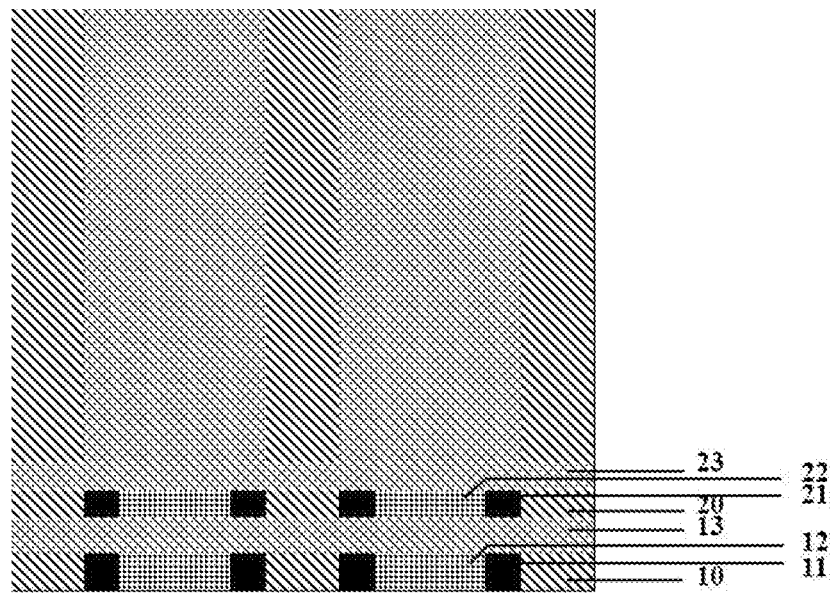
Figure 2K:
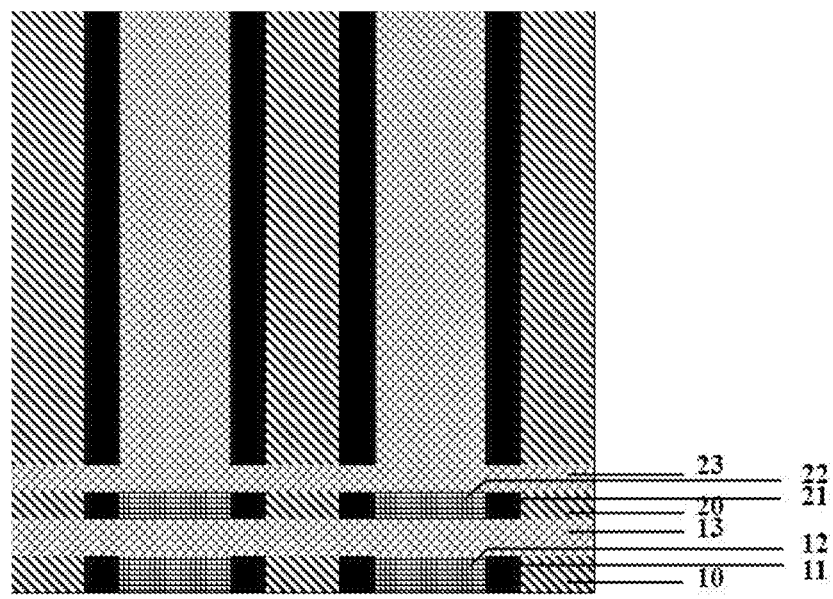
Figure 2L:
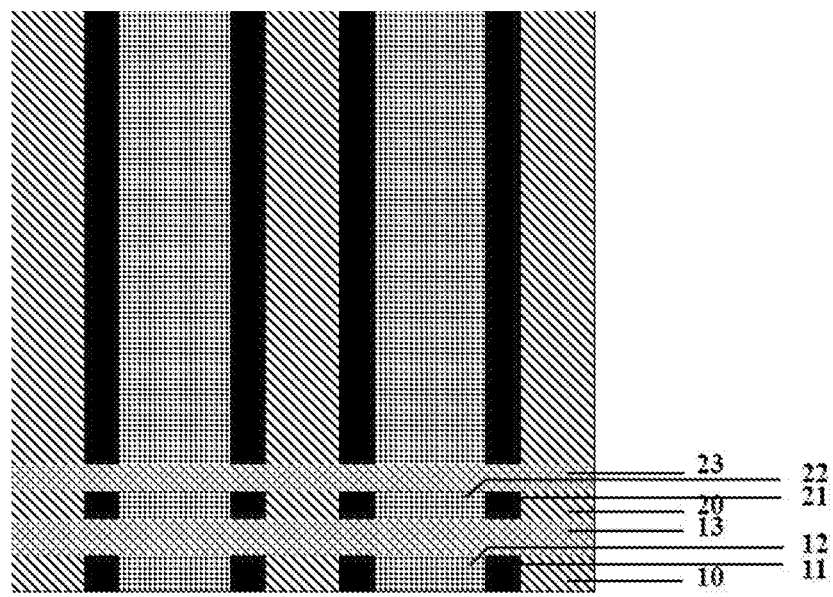
Figure 2M:
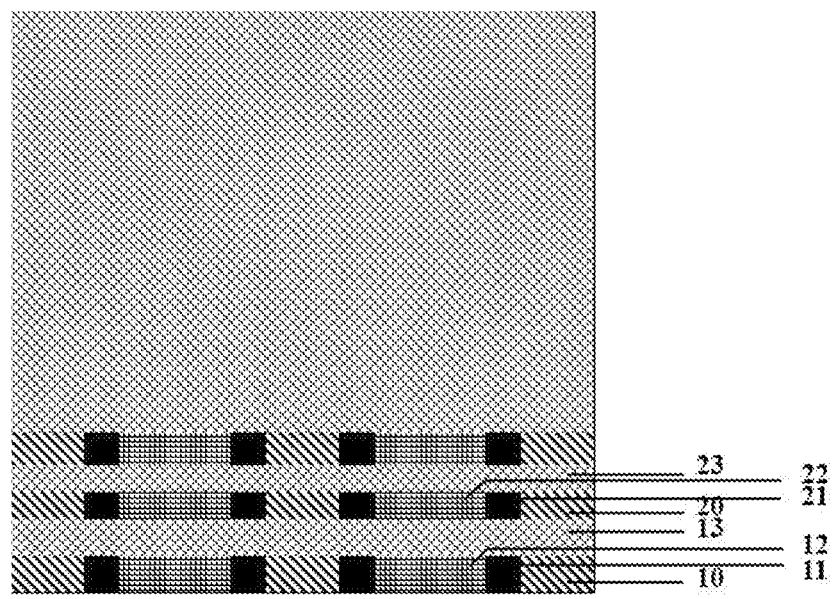
Figure 2N:
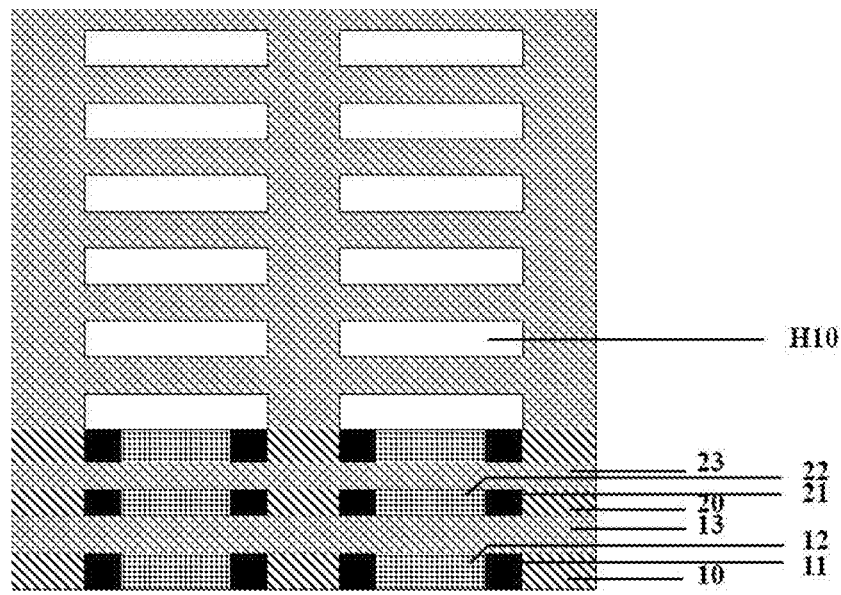
Figure 2O:
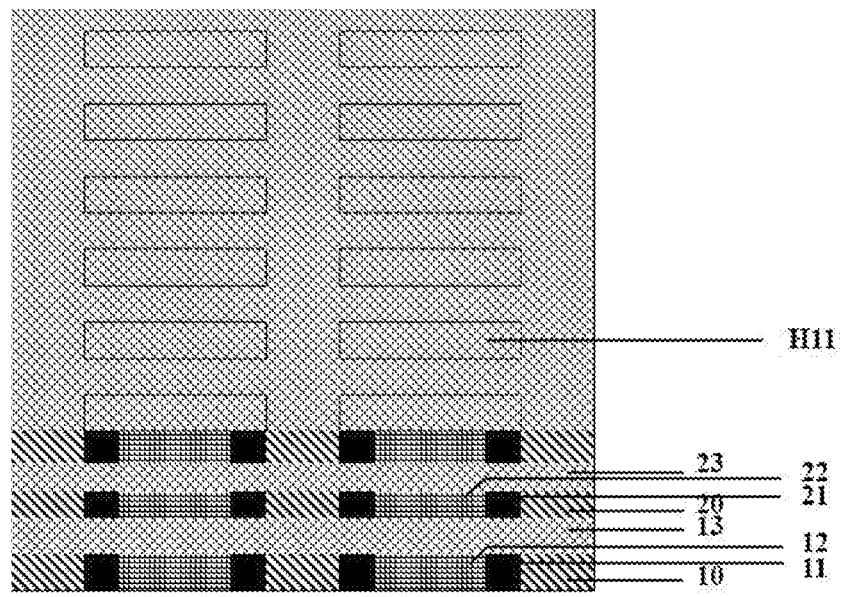
Figure 2P:
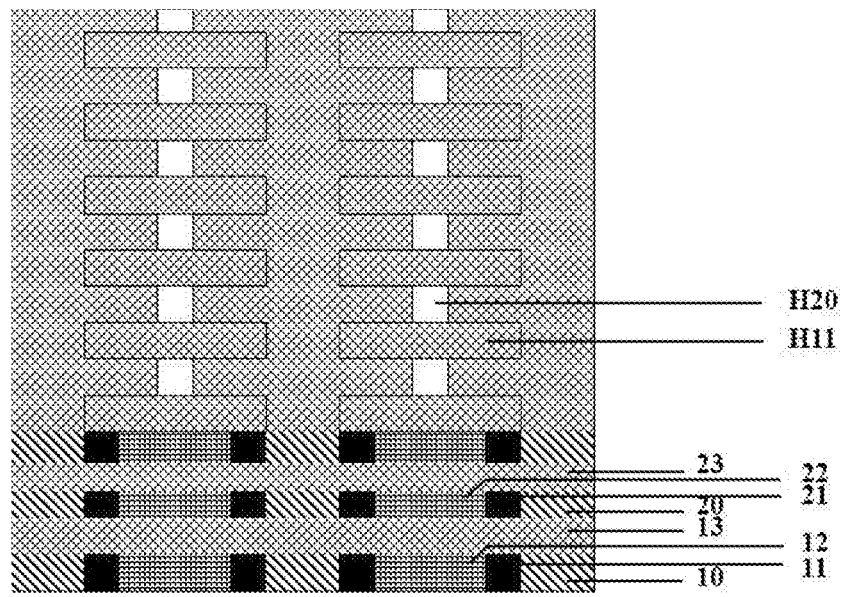
Figure 2Q:
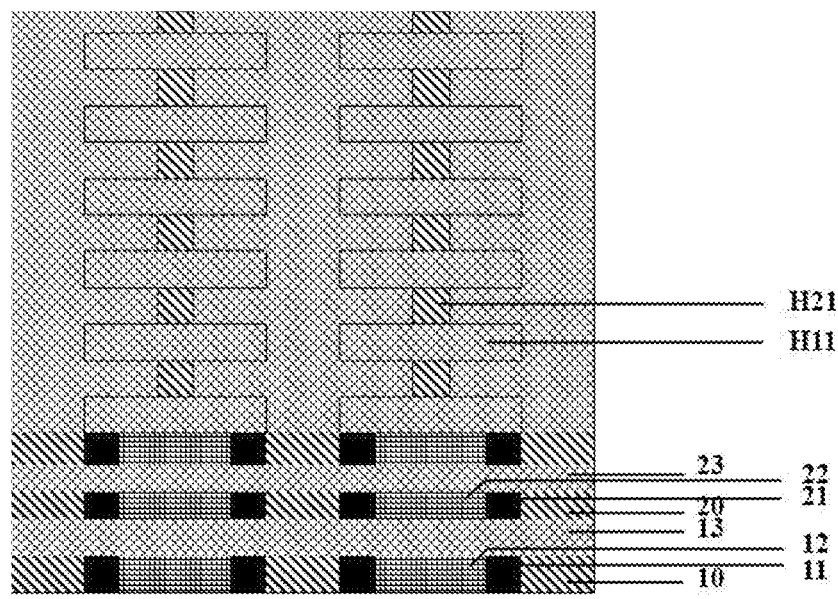
Figure 3:
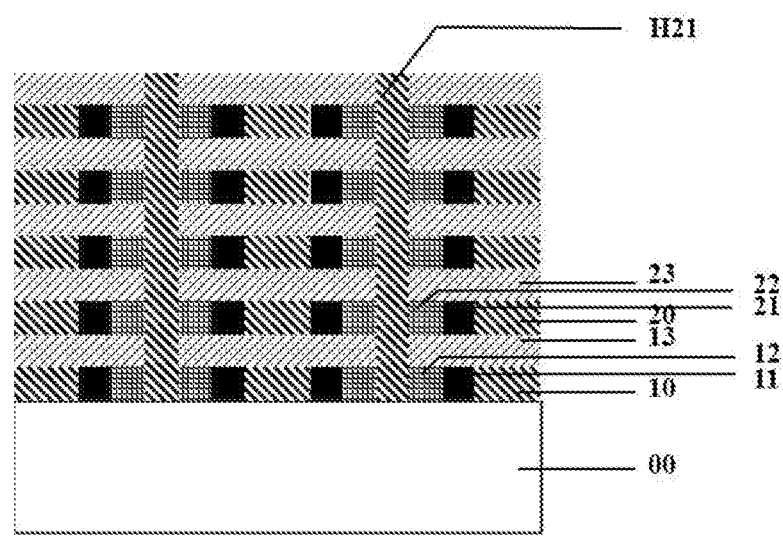
FIG. 3 is a cross-sectional view of a multilayer three-dimensional stacked phase change memory of the present disclosure.

Step 8: on the basis of the step 7, performing a photoetching process and depositing a 100 nm $SiO_2$ insulating material to form a second insulating layer 23, which covers the underlying structure and exposes second horizontal electrode pins, as shown in FIG. 1I and FIG. 2I.

Step 9: repeating the above steps for stacking more layers, as shown in FIG. 1J to FIG. 1M and FIG. 2J to FIG. 2M.

Step 10: preparing N−1*M insulating layer array through holes H10 at positions corresponding to the intervals of the horizontal electrodes, in which each of the insulating layer array through holes H10 has a width larger than the electrode interval, bottoms of the insulating layer array through holes H10 are the surface of the substrate, and the through holes H10 have a width of 17 μm and an interval of 6 μm; filling in a insulating material to achieve horizontal electrothermal isolation H11, as shown in FIG. 1N to FIG. 1O and FIG. 2N to FIG. 2O.

Step 11: preparing N−1*M−1 vertical electrode array square through holes H20 at positions corresponding to the intervals of the horizontal electrodes, in which bottoms of the through holes H20 are the substrate surfaces, and the through holes H20 have a side length of 17 μm; filling in an electrode material to obtain vertical electrodes H21, as shown in FIG. 1P to FIG. 1Q and FIG. 2P to FIG. 2Q.

In the present disclosure, N and M may each be a preset positive integer larger than or equal to 2, and specific dimensions of respective structures such as line width, interval and central gap can be flexibly adjusted according to needs.

In the present disclosure, the selector material may be a material known in the art such as GeSe.

It should be readily understood to those skilled in the art that the above description is only preferred embodiments of the present disclosure, and does not limit the scope of the present disclosure. Any change, equivalent substitution and modification made without departing from the spirit and scope of the present disclosure should be included within the scope of the protection of the present disclosure.

What is claimed is:

1. A method for preparing a three-dimensional stacked phase change memory, comprising following steps of:
   (1) preparing N strips of first horizontal electrodes that are parallel in a certain direction and spaced apart from each other on a substrate, where N is a preset positive integer greater than or equal to 2;

(2) preparing first strip-shaped phase change layers, each having a central gap, in regions corresponding to intervals between respective two adjacent electrodes of the first horizontal electrodes;

(3) preparing first selectors by filling a selector material in the central gaps of the first strip-shaped phase change layers;

(4) preparing a first insulating layer made of an insulating material such that the first insulating layer covers the first horizontal electrodes, the first strip-shaped phase change layers and the first selectors, with partial regions of the respective first horizontal electrodes exposed to form first horizontal electrode pins;

(5) preparing N strips of second horizontal electrodes on the first insulating layer such that the second horizontal electrodes have the same interval distribution as the first horizontal electrodes, and projections of the second horizontal electrodes on the first insulating layer are completely covered by projections of the first horizontal electrodes on the first insulating layer;

(6) preparing second strip-shaped phase change layers, each having a central gap, in regions corresponding to intervals between respective two adjacent electrodes of the second horizontal electrodes such that the second strip-shaped phase change layers have the same central gap distribution as the first strip-shaped phase change layers, and projections of the second strip-shaped phase change layers on the first insulating layer are covered by projections of the first strip-shaped phase change layers on the first insulating layer;

(7) preparing second selectors by filling a selector material in the central gaps of the second strip-shaped phase change layers;

(8) preparing a second insulating layer made of an insulating material such that the second insulating layer covers the second horizontal electrodes, the second strip-shaped phase change layers and the second selectors, with partial regions of the respective second horizontal electrodes exposed to form second horizontal electrode pins;

(9) preparing (N−1)×M insulating layer array through holes on a top-layer insulating layer, such that projections of the insulating layer array through holes correspond to regions corresponding to intervals between respective two adjacent electrodes of top-layer horizontal electrodes, each of the insulating layer array through holes has a width larger than the corresponding interval between the two adjacent electrodes, bottom surfaces of the insulating layer array through holes directly reach the substrate, and M is a preset positive integer greater than or equal to 2;

(10) filling an insulating material in the insulating layer array through holes to achieve electrothermal isolation in a horizontal direction;

(11) preparing vertical electrode array through holes between respective two adjacent insulating layer array through holes of the insulating layer array through holes whose projections correspond to regions corresponding to intervals between respective two adjacent electrodes of the top-layer horizontal electrodes, bottom surfaces of the vertical electrode array through holes directly reaching the substrate; and

(12) filling an electrode material in the vertical electrode array through holes, thereby forming a multilayer stacked phase change memory.

2. The method for preparing the three-dimensional stacked phase change memory of claim 1, further comprising, between the step (8) and the step (9), following steps of: sequentially repeating the steps (4) to (8) for several times to form multiple layers of horizontal electrodes, strip-shaped phase change layers, selectors and insulating layers.

3. The method for preparing the three-dimensional stacked phase change memory of claim 1, wherein in the step (11), a total number of the vertical electrode array through holes is (N−1)×(M−1).

4. The method for preparing the three-dimensional stacked phase change memory of claim 1, wherein in the step (2), for any two adjacent electrodes of the first horizontal electrodes, the first strip-shaped phase change layer with the central gap has a width greater than the interval between the two adjacent electrodes of the first horizontal electrodes by 0 to 4 μm.

5. The method for preparing the three-dimensional stacked phase change memory of claim 1, wherein in the step (3), for any two adjacent electrodes of the first horizontal electrodes, the first selector has a width greater than that of the central gap of the first strip-shaped phase change layer by 0 to 4 μm.

6. The method for preparing the three-dimensional stacked phase change memory of claim 1, wherein in the step (1), the first horizontal electrodes have a line width of 2 μm to 30 μm, and are spaced 8 μm to 60 μm apart.

7. The method for preparing the three-dimensional stacked phase change memory of claim 4, wherein in the step (2), for any two adjacent electrodes of the first horizontal electrodes, the first strip-shaped phase change layer with the central gap has a width greater than the interval between the two adjacent electrodes of the first horizontal electrodes by 0 to 2 μm, and outer edges of the first strip-shaped phase change layer are located on the first horizontal electrodes.

8. The method for preparing the three-dimensional stacked phase change memory of claim 5, wherein in the step (3), for any two adjacent electrodes of the first horizontal electrodes, the first selector has a width greater than that of the central gap of the first strip-shaped phase change layer by 0 to 2 μm, and outer edges of the first selector are located on the first strip-shaped phase change layer.

9. The method for preparing the three-dimensional stacked phase change memory of claim 1, wherein in the step (1), the first horizontal electrodes are spaced apart from each other at the same interval; and in the step (2), the first strip-shaped phase change layers have the same line width and the same center gap width.

10. A three-dimensional stacked phase change memory prepared by the method according to claim 1.

\* \* \* \* \*